(12) United States Patent
Huang et al.

(10) Patent No.: US 11,424,144 B2
(45) Date of Patent: Aug. 23, 2022

(54) CONFORMAL MANUFACTURING DEVICE AND METHOD FOR COMPLEX CURVED-SURFACE ELECTRONIC SYSTEM

(71) Applicant: HUAZHONG UNIVERSITY OF SCIENCE AND TECHNOLOGY, Hubei (CN)

(72) Inventors: Yongan Huang, Hubei (CN); Zhouping Yin, Hubei (CN); Hao Wu, Hubei (CN); Jiankui Chen, Hubei (CN); Wenlong Li, Hubei (CN); Kun Bai, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 807 days.

(21) Appl. No.: 16/340,380

(22) PCT Filed: Apr. 9, 2018

(86) PCT No.: PCT/CN2018/082255
§ 371 (c)(1),
(2) Date: Apr. 8, 2019

(87) PCT Pub. No.: WO2019/178899
PCT Pub. Date: Sep. 26, 2019

(65) Prior Publication Data
US 2021/0076503 A1    Mar. 11, 2021

(30) Foreign Application Priority Data
Mar. 22, 2018  (CN) .......................... 201810238266.8

(51) Int. Cl.
*H01L 21/67*   (2006.01)
*B29C 64/386*   (2017.01)
(Continued)

(52) U.S. Cl.
CPC ...... *H01L 21/67155* (2013.01); *B29C 64/112* (2017.08); *B29C 64/194* (2017.08);
(Continued)

(58) Field of Classification Search
CPC ......... B33Y 10/00; B33Y 30/00; B33Y 40/00; B33Y 50/00; B33Y 50/02; H05K 3/125;
(Continued)

(56) References Cited

U.S. PATENT DOCUMENTS

| | | | | |
|---|---|---|---|---|
| 7,658,603 B2 * | 2/2010 | Medina | ................. | B33Y 10/00 425/375 |
| 7,658,831 B2 * | 2/2010 | Mathieu | ................. | B33Y 80/00 205/183 |

(Continued)

FOREIGN PATENT DOCUMENTS

| | | | |
|---|---|---|---|
| CN | 103407290 A | * 11/2013 | |
| CN | 107512083 A | * 12/2017 | .............. B41J 2/015 |

OTHER PUBLICATIONS

Tan et al., Performance enhancement of InGaN light-emitting diodes by laser lift-off and transfer from sapphire to copper substrate, Appl. Phys. Lett. 84, 2757-2759, Apr. 7, 2004. (Year: 2004).*

*Primary Examiner* — Atul P. Khare
(74) *Attorney, Agent, or Firm* — JCIPRNET

(57) ABSTRACT

The invention belongs to a related field of electronic manufacturing technology, and particularly relates to a conformal manufacturing device and a method for a complex curved-surface electronic system, the system includes a support platform and a six-degree-of-freedom spherical motor linkage platform, a 3D measurement module, a laser lift-off module, a curved-surface transfer printing module and a conformal jet printing module respectively mounted on the support platform and independently controllable, and specific structures and work modes of these key components are improved. The invention further discloses a corresponding (Continued)

manufacturing method. Through the invention, multiple process flows required in conformal manufacturing process of the complex curved-surface electronic system are effectively integrated into an integrated device, so as to realize conformal hybrid manufacturing of the rigid/flexible curved-surface electronic system with arbitrary area, and the invention has advantages of high precision, high efficiency and high automation, which greatly broadens the application scope of the curved-surface electronic manufacturing technology.

9 Claims, 9 Drawing Sheets

(51) Int. Cl.

| | |
|---|---|
| H05K 3/12 | (2006.01) |
| B33Y 10/00 | (2015.01) |
| B33Y 30/00 | (2015.01) |
| B33Y 40/00 | (2020.01) |
| B29C 64/379 | (2017.01) |
| B29C 64/194 | (2017.01) |
| B29C 64/112 | (2017.01) |
| B29C 64/245 | (2017.01) |
| G01B 11/24 | (2006.01) |
| H05K 1/02 | (2006.01) |
| H05K 3/20 | (2006.01) |
| B33Y 50/00 | (2015.01) |
| B29C 64/209 | (2017.01) |
| B29C 64/30 | (2017.01) |

(52) U.S. Cl.
CPC .......... B29C 64/209 (2017.08); B29C 64/245 (2017.08); B29C 64/30 (2017.08); B29C 64/379 (2017.08); B29C 64/386 (2017.08); B33Y 10/00 (2014.12); B33Y 30/00 (2014.12); B33Y 40/00 (2014.12); B33Y 50/00 (2014.12); G01B 11/24 (2013.01); H05K 1/0284 (2013.01); H05K 3/125 (2013.01); H05K 3/207 (2013.01); H05K 2201/09018 (2013.01); H05K 2203/107 (2013.01); H05K 2203/16 (2013.01)

(58) Field of Classification Search
CPC ..... H05K 3/207; B29C 64/112; B29C 64/194; B29C 64/209; B29C 64/245; H01L 21/67155
USPC ........................................................ 29/592.1
See application file for complete search history.

(56) References Cited

U.S. PATENT DOCUMENTS

| | | | |
|---|---|---|---|
| 10,155,313 B2* | 12/2018 | Langford | B25J 5/02 |
| 10,462,907 B2* | 10/2019 | Lewis | H01L 23/5389 |
| 10,518,490 B2* | 12/2019 | Wicker | B33Y 10/00 |
| 10,569,464 B2* | 2/2020 | MacDonald | B29C 70/882 |
| 10,667,403 B2* | 5/2020 | Suzuki | B33Y 80/00 |
| 2010/0002402 A1* | 1/2010 | Rogers | H05K 1/028 |
| | | | 361/749 |
| 2013/0342592 A1* | 12/2013 | Merz | B33Y 30/00 |
| | | | 347/2 |
| 2017/0182717 A1* | 6/2017 | Byun | B28B 1/001 |

* cited by examiner

CONFORMAL MANUFACTURING DEVICE AND METHOD FOR COMPLEX CURVED-SURFACE ELECTRONIC SYSTEM

CROSS-REFERENCE TO RELATED APPLICATION

This application is a 371 application of International PCT application serial no. PCT/CN2018/082255, filed on Apr. 9, 2018, which claims the priority benefit of Chinese application No. 201810238266.8, filed on Mar. 22, 2018. The entirety of each of the abovementioned patent applications is hereby incorporated by reference herein and made a part of this specification.

BACKGROUND

Technical Field

The invention relates to a related field of electronic manufacturing technology, and particularly relates to a conformal manufacturing device and a method for a complex curved-surface electronic system.

Description of Related Art

At present, curved-surface integrated circuits, ultra-thin/flexible sensors, rigid microchips and other electronic components are usually manufactured based on a planar manufacturing process. Such planar manufacturing process is relatively complicated, which is not only applicable to various components with different sizes and characteristics, but also involves various process steps such as photolithography, peeling, transfer printing, packaging, etc. At present, a relatively mature application of the above planar manufacturing process is still mainly aimed at fabrication of planar, silicon-based microelectronic chips, but it is difficult to meet manufacturing requirements of electronic components with large areas and complex curved-surfaces. More specifically, the existing manufacturing technologies of electronic components mainly have following deficiencies:

Firstly, for a curved-surface positioning process which is a basis of the whole manufacturing process, the conventional micro-electronic system based on planar processing mainly adopts a visual positioning method, but a two-dimensional (2D) attribute of visual image acquisition results in a fact that effective positioning is only implemented for a 2D plane, and a three-dimensional (3D) positioning requirement of a rigid/flexible curved-surface electronic system cannot be satisfied; moreover, the conventional measurement method mainly uses a coordinate measurement machine (CMM) to measure the curved-surface point by point, which inevitably brings about problems such as large measurement data, slow measurement efficiency, slow data processing, large influence of light environment, etc.

Secondly, high-performance electronic components in the curved-surface electronic systems need to be manufactured through a photolithographic process, and ultra-thin flexible electronic components need to be peeled off from a planar silicon/glass substrate (a silicon-based microelectronic packaging process also needs to peel off small-sized microelectronic components from elastic blue films), a common peeling technology in the existing techniques mainly includes a thimble peeling technology, i.e. to mainly use a thimble to break the microelectronic component and a substrate at a boundary, for example, China patent application No. CN201510531234.3, etc., discloses a multi-thimble peeling technique. However, since it needs to utilize a brittle characteristic of the microelectronic component and the substrate, it is hard to be applied to the peeling process of a flexible electronic substrate, and it cannot meet peeling requirements of high reliability and high compatibility of large-area, ultra-thin, flexible electronic components.

Thirdly, after the ultra-thin flexible electronic component is peeled off from the planar substrate, a transfer printing technology is required to transfer the flexible electronic component from the planar substrate to a curved-surface substrate; a transfer printing process at present is usually realized by controlling a relative adhesion force between two interfaces of the electronic component and the substrate and a pickup device. A commonly used transfer printing method includes mechanical-control transfer printing, surface relief-assisted transfer printing, transfer head load changing transfer printing, electrostatic adsorption transfer printing, etc. However, such type of flexible electronic transfer printing method is more suitable for a plane-to-plane transfer printing, and it is unable to realize a plane-to-curved-surface transfer printing with high precision. Moreover, Haoyi Wu, et al. proposed a curved-surface transfer printing method in "Conformal Pad-Printing Electrically Conductive Composites onto Thermoplastic Hemispheres: Toward Sustainable Fabrication of 3-Cents Volumetric Electrically Small Antennas", which uses deformability of a soft transfer head to preliminarily implement the plane-to-curved-surface transfer printing, but the transfer printing process depends on the deformation of the soft transfer head itself, which is uncontrollable and excessive deformation may exacerbate internal stress generated in the component during the transfer printing process; and Heung Cho Ko et al. proposed a transfer printing method for an elastomer structure in "Curvilinear Electronics Formed Using Silicon Membrane Circuits and Elastomeric Transfer Elements" to mitigate the above problem, however, this method is complicated in process and cannot guarantee transfer accuracy and cannot be applied to higher temperature conditions.

Finally, after completing transfer of a plurality of flexible electronic components and microchips from the planar substrate to a curved-surface substrate, conductive interconnection is required to complete functional integration of the entire flexible electronic system, which requires to produce a low-cost interconnect structure with good conductivity on the curved-surface substrate. However, the current photolithography process needs to go through a tedious process of glue coating, masking, photolithography, development, etc., and the whole process cannot be completed on curved-surface. Although inkjet printing technology may print patterns on a curved-surface in a conformal manner, an ink viscosity compatible with conventional piezoelectric/thermal bubble jet printing technology is 5-100 cps, which cannot meet jet printing of the most commonly used high-viscosity nano-silver paste material (with viscosity of 3000-10000 cps) in the field of printed circuit board. In addition, there are some deficiencies such as low jet printing resolution, easy blockage of nozzle, incompatibility with high-viscosity ink, etc. Namely, there is no ideal inkjet printing technology currently that may be compatible with the high-viscosity nano-silver paste and achieve conductive interconnect structures through curved-surface conformal jet printing.

In conclusion, there is an urgent need to make further amelioration or improvements for the above technical problems of the field in order to better meet the modern manufacturing needs of higher automation, higher quality and higher efficiency for comprehensive production of various complex curved-surface electronic systems.

SUMMARY

In view of the above defects or improvement requirements of the prior art, the invention provides a conformal manufacturing device and a method for a complex curved-surface electronic system, where not only an overall structural layout of the conformal manufacturing device is redesigned, but also multiple aspects such as specific compositions, working modes, etc., of a plurality of key components such as a curved-surface transfer printing module, a laser lift-off module, a conformal jet printing module, etc., are ameliorated, and compared with the existing electronic manufacturing equipment, not only high-precision manufacturing requirements of various rigid/flexible complex curved-surface electronic systems are met, but also characteristics of a high automation degree and suitable for mass production, etc., are also achieved, so that it is especially suitable for manufacturing applications of complex curved-surface electronic systems such as aerospace smart skin, flexible curved-surface display, flexible sensors, household appliances, flexible energy sources, etc.

In order to achieve the above objects, the invention provides a conformal manufacturing device for a complex curved-surface electronic system, the conformal manufacturing device is suitable for hybrid manufacturing of a rigid or flexible curved-surface electronic component, and includes a support platform, and a spherical motor linkage platform, a three-dimensional (3D) measurement module, a laser lift-off module, a curved-surface transfer printing module and a conformal jet printing module respectively mounted on the support platform and independently controllable, characterized in that:

The spherical motor linkage platform includes a linkage platform planar motion portion and a spherical motor portion, where the linkage platform planar motion portion is directly disposed on the support platform, and has an X-direction motion axis adapted to move along an X-axis direction and a Y-direction motion axis adapted to move along a Y-axis direction; the spherical motor portion is continuously arranged on the linkage platform planar motion portion and moves along with the linkage platform planar motion portion, and the spherical motor portion is adhered with a rigid curved-surface substrate or a curved-surface underlayment carrying a flexible curved-surface substrate, and drives curved-surface substrate or the curved-surface underlayment to rotate to any required posture in space;

The 3D measurement module includes a measurement sensor support frame, a measurement module planar motion portion, a 3D laser measurement sensor, and a measurement light source, where the measurement sensor support frame is directly disposed on the support platform; the measurement module planar motion portion is installed on the measurement sensor support frame, and has a Y-direction measurement motion axis adapted to move along the Y-axis direction and a Z-direction measurement motion axis adapted to move along a Z-axis direction; moreover, the 3D laser measurement sensor is continuously installed on the measurement module planar motion portion, and is moved to a required position along with the measurement module planar motion portion, and is configured to perform point cloud acquisition on the curved-surface substrate or the curved-surface underlayment adhered to the spherical motor portion in collaboration with the measurement light source, and then generate a point cloud module to perform a matching calculation with a corresponding design model;

The laser lift-off module includes a laser, a peeling module planar motion portion, a peeling support clamp and a peeling observation camera, where the laser is disposed under the support platform, and is configured to emit laser radiation through a matched optical path portion, thereby peeling off an electronic component lithographically printed on a transparent rigid planar substrate from the planar substrate; the peeling module planar motion portion is disposed above the laser, and has an X-direction peeling motion axis adapted to move along the X-axis direction and a Y-direction peeling motion axis adapted to move along the Y-axis direction; the peeling support clamp is continuously installed on the peeling module planar motion portion, and is moved to a required position along with the peeling module planar motion portion, and is configured to fix and clamp the electronic component lithographically printed on the planar substrate to execute a laser lift-off operation. Moreover, the peeling observation camera is disposed near the peeling module planar motion portion, and is configured to acquire position information of the peeling module planar motion portion in collaboration with a peeling light source;

The curved-surface transfer printing module includes a transfer head support frame, a transfer printing module planar motion portion, a curved-surface transfer head and a transfer printing positioning camera, where the transfer head support frame is directly disposed on the support platform; the transfer printing module planar motion portion is installed on the transfer head support frame, and has an X-direction transfer printing motion axis adapted to move along the X-axis and a Z-direction transfer printing motion axis adapted to move along the Z-axis; moreover, the curved-surface transfer head is continuously installed on the transfer printing module planar motion portion, and is moved to a required position along with the transfer printing module planar motion portion, and is configured to transfer print the electronic component completing the peeling operation executed by the laser lift-off module to the curved-surface substrate; moreover, the transfer printing positioning camera is configured to acquire position information of the transfer printing module planar motion portion in collaboration with a transfer printing light source;

The conformal jet printing module includes a nozzle support frame, a jet printing module planar motion portion, a nozzle portion, a jet printing observation camera and an ink droplet observation camera, where the nozzle support frame is disposed on the support platform along the Z-axis direction; the jet printing module planar motion portion is installed on the nozzle support frame, and has an X-direction jet printing motion axis adapted to move along the X-axis and a Z-direction jet printing motion axis adapted to move along the Z-axis; the nozzle portion is continuously installed on the jet printing module planar motion portion, and is moved to a required position along with the jet printing module planar motion portion, and is configured to continuously jet-print a paste on a surface of the curved-surface substrate completing the transfer operation executed by the curved-surface transfer printing module, so as to fabricate a conductive interconnection structure; moreover, the jet printing observation camera is configured to acquire a jet printing trajectory and effect on the curved-surface substrate in collaboration with a jet printing light source, and the ink droplet observation camera is configured to acquire a state of an ink droplet sprayed by the nozzle portion in collaboration with an ink droplet observation light source.

Preferably, regarding the 3D measurement module, during the whole point cloud acquisition process of the 3D laser measurement sensor, a position of the three-dimensional laser measurement sensor is preferably adjusted constantly, and a spacing between the three-dimensional laser measurement sensor and the curved-surface substrate or the curved-surface underlayment in the Z-axis direction, i.e. a vertical direction, remains unchanged.

Preferably, regarding the laser lift-off module, the optical path portion thereof is preferably arranged on the support platform along the Z-axis direction through an optical path support frame, and is configured to shape, uniform and adjust a direction of a laser beam emitted by the laser; moreover, a tail end of the optical path portion is located right above the peeling module planar motion portion.

Preferably, a fine gridding mask is adopted to control a peeling laser intensity, i.e., the number of laser irradiations and laser irradiation energy on the electronic component lithographically printed on the transparent rigid planar substrate are controlled by adjusting a gridding feature width and spacing of the fine gridding mask.

Preferably, regarding the curved-surface transfer printing module, the curved-surface transfer head thereof preferably works in an active-passive combination way: first, a preliminary multi-point active conformal with the curved-surface substrate is achieved through an adjustable sliding component array (for example, 3*3=9) inside the curved-surface transfer head and a plurality linear driving components controlling an axial position thereof, and then a complete distributed passive conformal with the curved-surface substrate is achieved based on a deformable thin-film of the curved-surface transfer head itself.

Preferably, regarding the conformal jet printing module, the nozzle portion thereof preferably includes an integrated ink supply assembly and an air sheath assisted nozzle assembly connected to the integrated ink supply assembly, where the integrated ink supply assembly is configured to automatically supply ink to the air sheath assisted nozzle assembly, and is adapted to implement automatic switch between a flow driving mode and air pressure driving mode; the air sheath assisted nozzle assembly is used for jet-printing the ink onto the curved-surface substrate, and an annular electrode is preferably arranged under the nozzle thereof.

Preferably, the conformal manufacturing device further includes a control module configured to execute functions of receiving, processing and transmitting electrical control signals throughout the manufacturing process.

On the other hand, the invention further provides a conformal manufacturing method including following steps:

Step One: 3D Measurement and Positioning Operation

First, tightly mounting a rigid or flexible curved-surface substrate on the linkage platform planar motion portion of the spherical motor linkage platform, and setting three-dimensional measurement and positioning process parameters for the 3D laser measurement sensor, and performing scanning on the curved-surface substrate according to a measured motion trajectory path to generate a point cloud model; performing position matching on the point cloud model and a design model, and determining whether an error accuracy requirement required for a subsequent process is met, and if the error accuracy requirement is not met, reproducing or mounting the curved-surface substrate until the error accuracy requirement is met;

Step Two: Laser Lift-Off Operation

Depositing a laser release layer (such as laser amorphous silicon) on a planar substrate (such as a transparent quartz glass substrate), manufacturing the flexible electronic component on top of the laser release layer by using a microelectronic process, and then moving the electronic component lithographically printed on the planar substrate to a required position and fixedly clamping the electronic component by the peeling support clamp, and then accurately placing a transparency-controllable patterned mask having a semi-transparent area at a specified position between the flexible electronic component and a light outlet at an optical path tail end for adjusting and controlling the laser irradiation energy absorbed by the laser release layer, so as to achieve selective laser lift-off, and peeling off the electronic component from the planar substrate by adjusting a laser lift-off process parameter; meanwhile, adopting the peeling observation camera to perform positioning and observation;

Step Three: Curved-Surface Transfer Printing Operation

Using the transfer printing positioning camera to perform positioning, and moving the curved-surface transfer head to a designated position above the electronic component completing the laser lift-off operation; and then opening an air pressure adsorption function, the curved-surface transfer head moving vertically and downwards to contact the electronic component, so as to pick up the electronic component by a negative pressure; and then again using the transfer printing positioning camera to perform positioning, and moving the curved-surface transfer head to a designated position above the curved-surface substrate, and adjusting a posture and a position of the curved-surface substrate through the six-degree-of-freedom spherical motor linkage platform, so that a current transfer printing position is directly below the curved-surface transfer head; and completely transferring the electronic component to the curved-surface substrate through a quadratic conformal method;

Step Four: Conformal Jet Printing Operation

First adjusting conformal jet printing process parameters, and selecting the flow or air pressure ink supplying mode according to the need, and moving the nozzle portion to a place of the ink droplet observation camera, using the ink droplet observation camera to observe an ink droplet state under the nozzle, and recording all process parameters required for stable injection when the ink droplet forms a stable Taylor cone; and then introducing a six-degree-of-freedom motion trajectory of the conformal jet printing, performing on-demand jet printing on the curved-surface substrate according to a predetermined conformal jet printing trajectory path, and using the jet printing observation camera to position and observe the conformal jet printing process; and when the curved-surface conformal on-demand jet printing is completed, again using the jet printing observation camera to perform positioning calibration on pins of the electronic component, and connecting pin pairs of the electronic component one-by-one according to pin position information;

Finally, replacing the entire manufacturing system to complete the conformal manufacturing process of the complex curved-surface electronic system.

Further preferably, regarding the above step three, the quadratic conformal method is preferably operated by means of active-passive combination:

First, moving the curved-surface transfer head to a designated position above the curved-surface substrate, and executing preliminary multi-point active conformal; then, attaching the electronic component and the curved-surface substrate to execute quadratic distributed passive conformal by using the deformable thin-film of the curved-surface transfer head itself; finally, using the positive air pressure to expand the deformable thin-film of the curved-surface transfer head to separate the electronic component from the curved-surface transfer head, so as to complete the operation of transfer printing the electronic component to the curved-surface substrate.

In overall, compared to the existing techniques, the above technical solution conceived by the invention has following technical advantages:

1. By redesigning the overall structural composition and a spatial layout of the conformal manufacturing device, especially improving specific composition and working modes of some key components, such as the laser lift-off module, the curved-surface transfer printing module, the conformal jet printing module, etc., not only the conformal hybrid manufacturing of rigid/flexible curved-surface electronic system is realized for the first time, but also the flexible electronic component manufactured through the photolithographic process may be integrated with a microelectronic system through the laser lift-off and curved-surface transfer printing process, and meanwhile the blocked photolithographic flexible electronic components and the microelectronic system are interconnected through the conformal jet printing process to realize conformal manufacturing of the rigid/flexible curved-surface electronic system of an arbitrary area, which breaks through a curved-surface technical barrier of the conventional flexible electronic system, so that mass production may be carried out, which greatly improves production efficiency.

2. The invention further optimizes a specific structural composition and a working mode of the 3D laser measurement module, and by integrating and adopting the 3D laser point cloud scanning technique, not only limitation of a mature visual positioning measurement system is effectively broken through, but also the deficiencies of the conventional 3D measurement system, such as slow measurement speed and vulnerable to ambient environment are remarkably overcome, and the point cloud splicing information of the measured curved-surface may be efficiently, quickly and accurately obtained, and the requirement on the surface and ambient light condition of the measured curved-surface is significantly reduced, which enhances universality thereof and improves its stability, reliability and success rate.

3. By optimizing the component structure and working mode corresponding to laser lift-off process, a practical test shows that an interface adhesion strength of the flexible electronic component and the planar substrate may be adjusted and controlled in high precision to achieve the purpose of selective peeling; and the flexible electronic component after peeling may be still adhered to the rigid underlayment without completely falling off, thereby avoiding direct damage to the flexible electronic component by the subsequent process and improving a process yield;

4. By optimizing the component structure and the working mode corresponding to the conformal jet printing process, not only convenience and operation efficiency of precise ink supplying are significantly improved, but also coordination of the air sheath assisted function and the annular electrode makes the jet printing process more stable, and may drive flying droplets to accurately deposit on a specified position, thereby avoiding an influence of a non-uniform electric field caused by the rigid curved-surface substrate/curved-surface underlayment on jet printing precision, and improving an application range and flexibility.

5. The conformal manufacturing device designed by the invention also integrates the six-degree-of-freedom spherical motor linkage technology to decouple a complex curved-surface motion, and realize rotational displacement transformation by using the spherical motor portion, so as to avoid accumulating errors; and meanwhile the complex and tedious vector transformation and post-processing process in the conventional five-axis linkage technology is omitted, which significantly improves motion trajectory analytical efficiency; and combined with the advantage of flexibility of the spherical motor, the overall speed and efficiency of the complex curved-surface motion are improved, and the area and scope of conformal manufacturing of the rigid/flexible curved-surface electronic system are expanded, which breaks through the barrier of limitation in manufacturing curvature, and expand an application scope of the manufacturing process.

6. The device and method provided by the invention may be better applied to the curved-surface transfer printing process as a whole, and meet the requirements of the integrated curved-surface transfer printing process of the flexible electronic component from the planar substrate to the rigid/flexible curved-surface substrate, and overcome an influence of an excessive deformation force on the transferred component in a few completely passive transfer printing modes, and the inability to accurately control the deformation, which obviously improves the accuracy, efficiency, reliability and success rate of the curved-surface transfer printing.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. It should be understood that the specific embodiments described herein are merely used for explaining the invention and are not intended to be limiting of the invention. Furthermore, the technical features involved in the various embodiments of the invention described below may be combined with each other as long as they do not conflict with each other.

Figure 1:
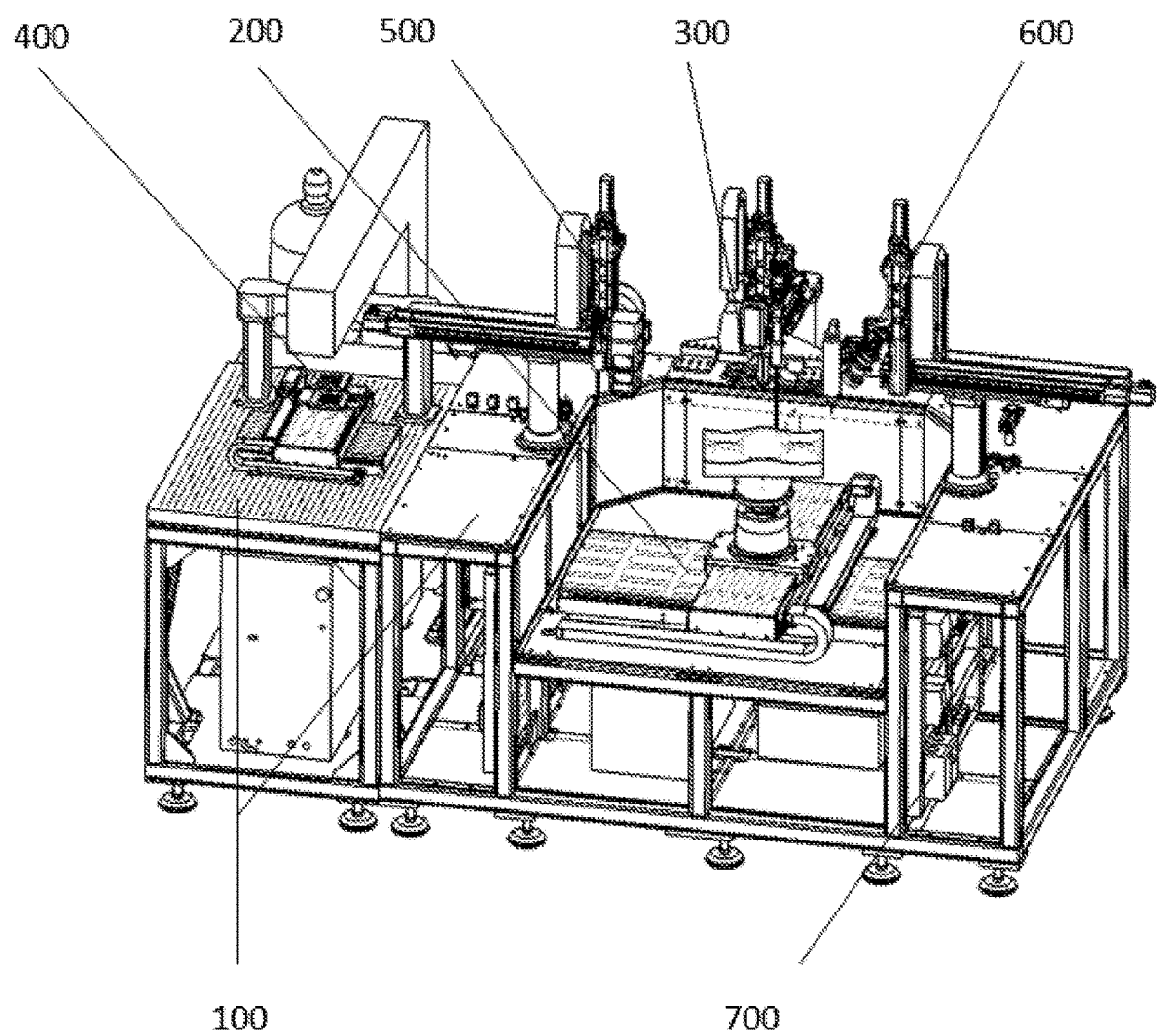
FIG. 1 is a schematic diagram of an overall construction of a conformal manufacturing device constructed according to the invention.
Figure 2:
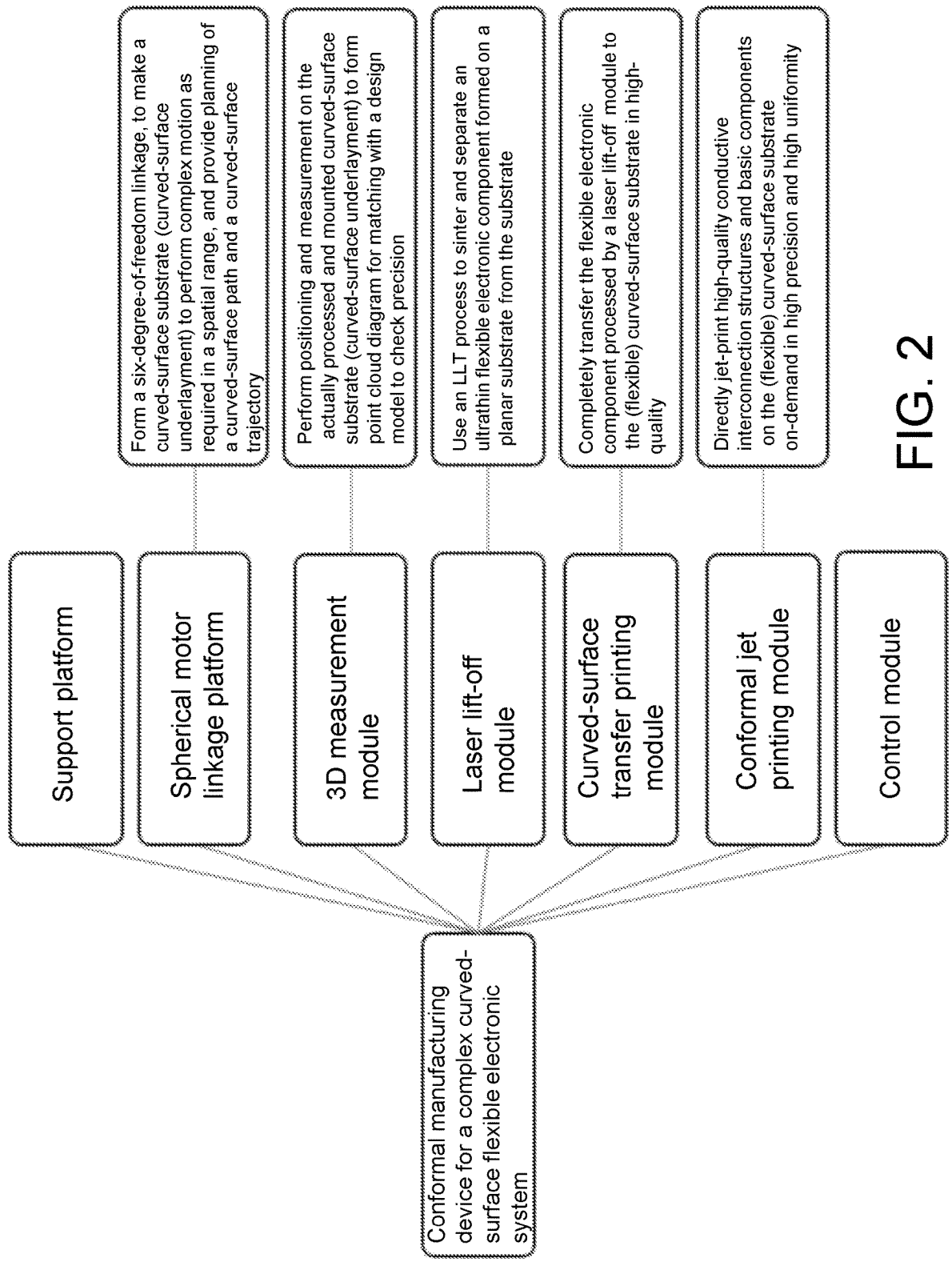
FIG. 2 is a schematic diagram of module composition and a working principle of the conformal manufacturing device constructed according to the invention.

FIG. 1 is a schematic diagram of an overall construction of a conformal manufacturing device constructed according to the invention, and FIG. 2 is a schematic diagram of module composition and a working principle of the conformal manufacturing device constructed according to the invention. As shown in FIG. 1 and FIG. 2, the conformal manufacturing device is suitable for hybrid manufacturing of rigid or flexible curved-surface electronic components, and includes functional components such as a support platform 100, and a spherical motor linkage platform 200, a three-dimensional (3D) measurement module 300, and a laser lift-off module 400, a curved-surface transfer printing module 500, a conformal jet printing module 600, etc., that are respectively mounted on the support platform 100 and independently controllable, which are described one-by-one below in detail.

Figure 3:
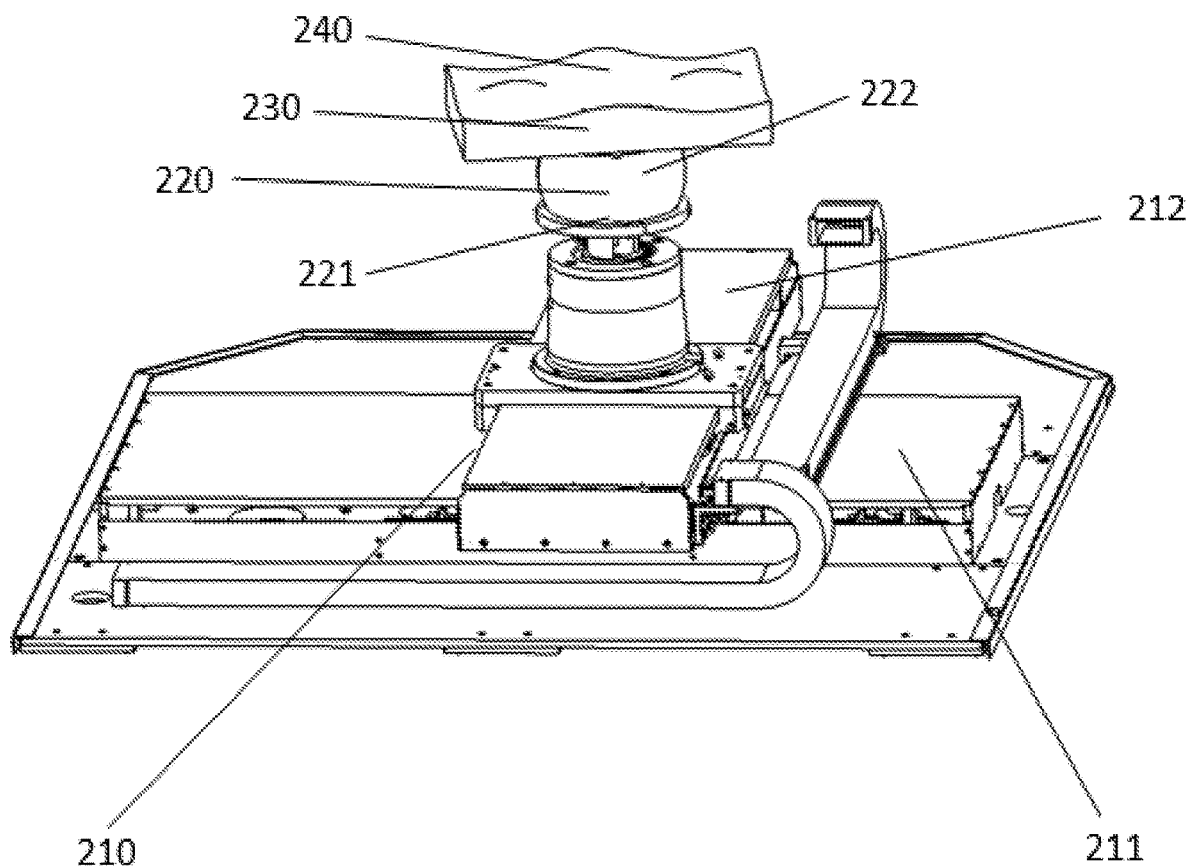
FIG. 3 is a schematic diagram of a detailed structure of a spherical motor linkage platform module shown in FIG. 1.

Referring to FIGS. 1 and 3, the spherical motor linkage platform 200 includes a linkage platform planar motion portion 210 and a spherical motor portion 220, where the linkage platform planar motion portion 210 is directly arranged on the support platform, and has an X-direction motion axis 211 adapted to move along an X-axis direction and a Y-direction motion axis 212 adapted to move along a Y-axis direction; the spherical motor portion 220 is continuously disposed on the linkage platform planar motion portion 210 and moves along with the linkage platform planar motion portion 210, and the spherical motor portion 220 is adhered with a rigid or flexible curved-surface substrate, and drives the curved-surface substrate to rotate to any required posture in space.

To be specific, referring to FIG. 3, the linkage platform planar motion portion 210 is disposed on the support platform 110, and the spherical motor portion 220 is disposed on the linkage platform planar motion portion 210; a rigid curved-surface substrate 230 (for rigid curved-surface electronics) or a curved-surface underlayment 230 attached with a flexible curved-surface substrate 240 (for flexible curved-surface electronics) is disposed on the spherical motor portion 220.

According to a preferable embodiment of the invention, the spherical motor portion 220 may mainly include a stator assembly 221 fixed to the support platform 100, and a mover assembly 222 fixed to the curved-surface underlayment 230; the stator assembly 221 is regularly distributed with coils, and the mover assembly 222 is regularly distributed with permanent magnets. In this way, the spherical motor portion 220 may make a full use of an electromagnetic field to control a rotation angle, and it has advantages of high speed and wide range of motion, which improves motion flexibility in the conformal manufacturing process of rigid/flexible curved-surface electronic system and improves manufacturing efficiency. Moreover, not only a conformal manufacturing direction of the rigid/flexible curved-surface electronic system is maintained in a normal direction of the curved-surface, but also the six-degree-of-freedom spherical motor linkage technology may decouple the motion, i.e. translation and rotation functions of the complex curved-surface motion are respectively achieved by the planar motion portion and the spherical motor portion, so as to avoid accumulating errors. In a coupling process of complex curved-surface motion information, a nested coordinate system is used, which eliminates the complicated and tedious vector transformation and post-processing process in the conventional five-axis linkage technology, and reduces a space occupation and motion error accumulation caused by superposition of the rotation axes.

It should be noted that vertical axes (a Z-direction measurement motion axis 322, a Z-direction transfer printing motion axis 522, and a Z-direction jet printing motion axis 622) where working heads (a 3D laser measurement sensor 330, a curved-surface transfer head 530, a nozzle portion 630) of the spherical motor linkage platform 200 and other modules (the 3D measurement module 300, the curved-surface transfer printing module 500, the conformal jet printing module 600) locate are combined to form a six-degree-of-freedom linkage, to make the rigid curved-surface substrate/curved-surface underlayment 230 to perform arbitrary complex curved-surface motion along with the working heads as required in a spatial range, and to provide curved-surface trajectory planning for scanning measurement, curved-surface transfer printing and conformal jet printing. There is one and only one of the vertical axes being in a working position and a working state at the same time. The planar motion portion 210 is used for making the curved-surface substrate to realize a translation motion within a stroke range thereof; and the spherical motor portion 220 is used for making the curved-surface substrate to realize rotation in any direction in the space range. During a working process of the spherical motor portion 220, the coils regularly distributed on the stator assembly 221 are introduced with electrical signals of different intensities according to a control signal to form electromagnetic fields of different intensities, which may interact with the permanent magnets regularly distributed on the mover assembly 222 to achieve that the spherical motor portion 220 may be quickly rotated to a specified posture in high precision and high sensitivity in any direction. The spherical motor portion may be added with improved devices such as a gravity balance device, a posture detection device, etc., to further improve the motion sensitivity and control accuracy thereof. Regarding the flexible curved-surface electronics, the curved-surface underlayment 230 is used for supporting the flexible curved-surface substrate 240 adhered to it in an adhesion manner.

Figure 4:
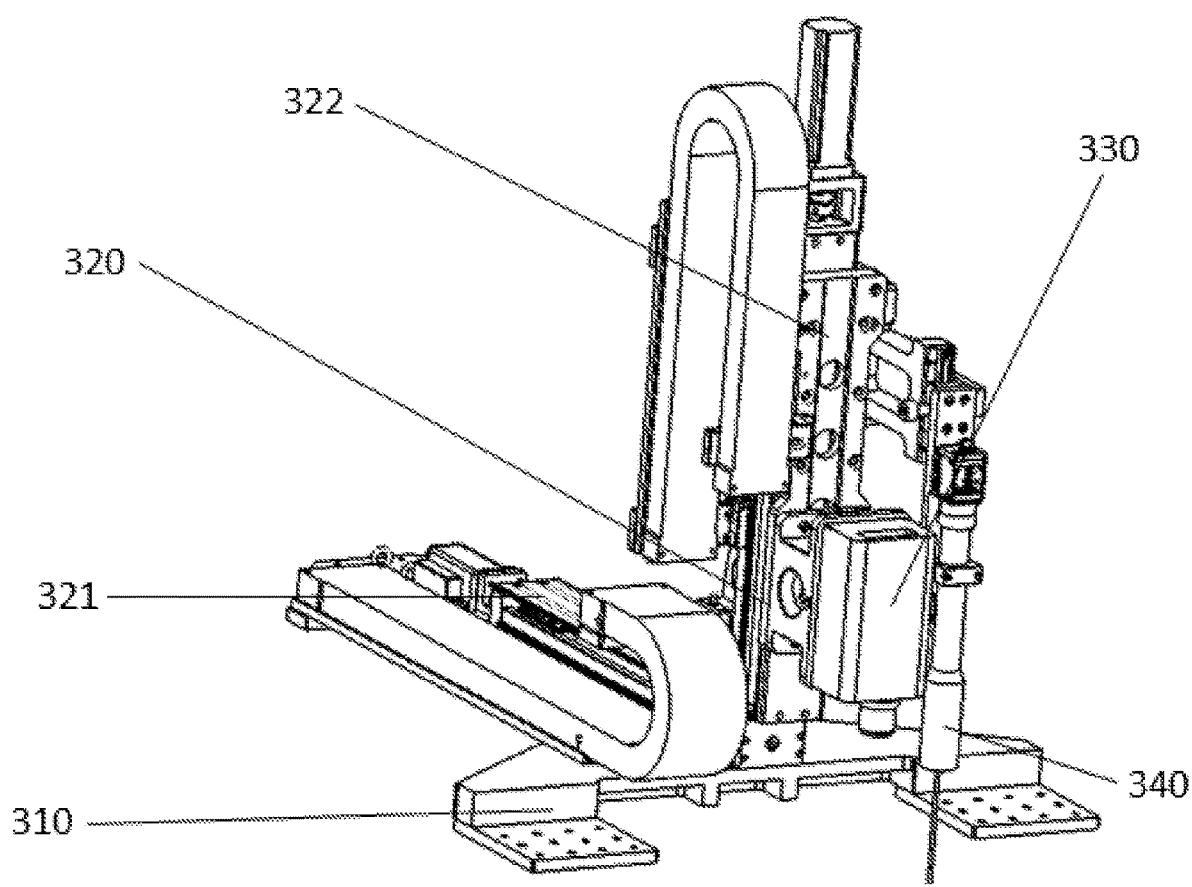
FIG. 4 is a schematic diagram of a detailed structure of a 3D measurement module shown in FIG. 1.

Referring to FIGS. 1 and 4, the 3D measurement module 300 includes a measurement sensor support frame 310, a measurement module planar motion portion 320, a 3D laser measurement sensor 330 and a measurement light source 340, where the measurement sensor support frame 310 is directly disposed on the support platform; the measurement module planar motion portion 320 is installed on the measurement sensor support frame 310, and has a Y-direction measurement motion axis 321 adapted to move along the Y-axis direction and a Z-direction measurement motion axis 322 adapted to move along a Z-axis direction. Moreover, the 3D laser measurement sensor 330 is continuously installed on the measurement module planar motion portion 320, and is moved to a required position along with the measurement module planar motion portion 320, and is configured to perform point cloud acquisition on the curved-surface substrate adhered to the spherical motor portion 220 in collaboration with the measurement light source 340, and then generate a point cloud module to perform a matching calculation with a corresponding design model.

Figure 5:
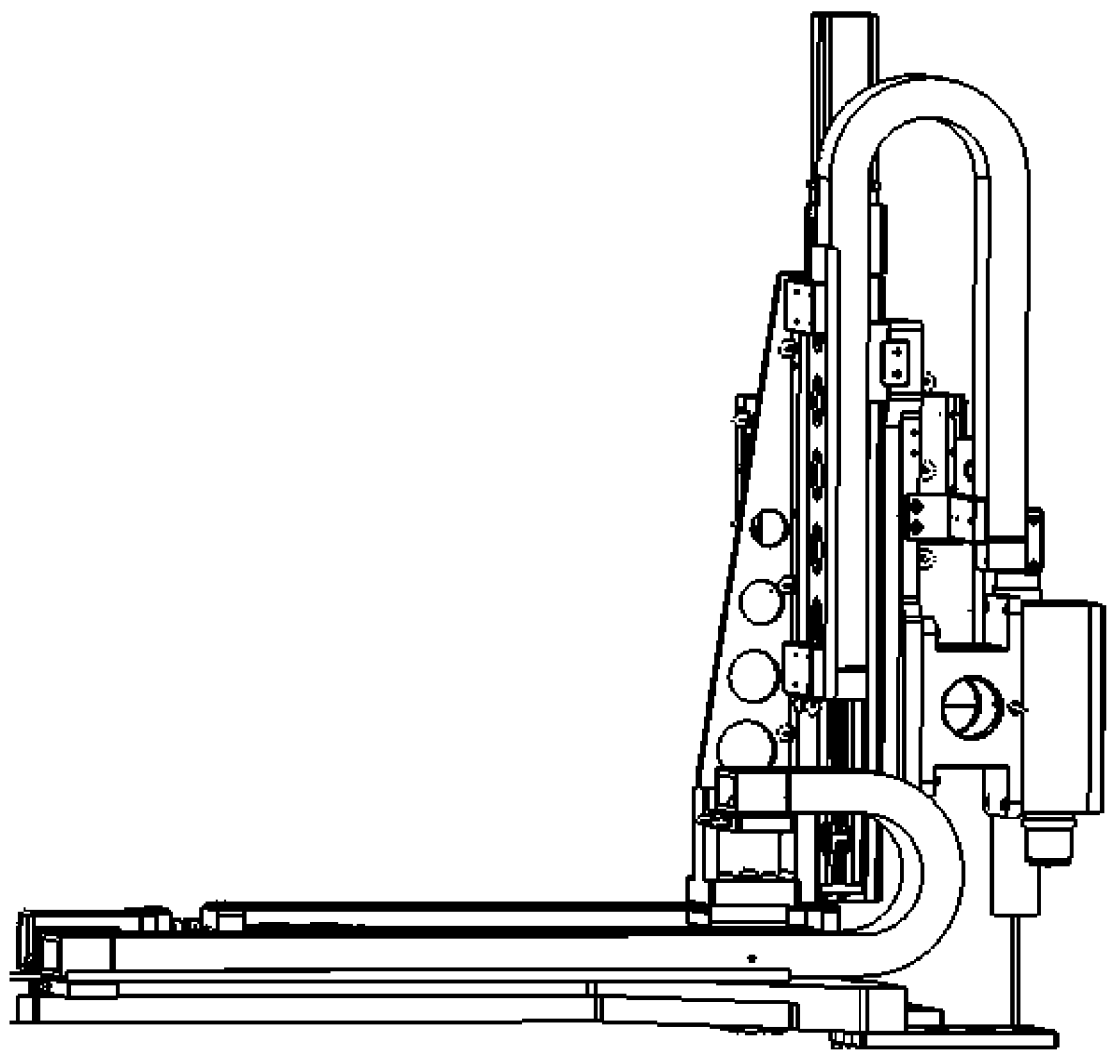
FIG. 5 is a structural side view of the 3D measurement module.

To be specific, referring to FIG. 4 and FIG. 5, the measurement sensor support frame 310 is disposed on the support platform 100, the measurement module planar motion portion 320 is disposed on the measurement sensor support frame 310, and may be perpendicular to the planar motion portion 210; the 3D laser measurement sensor 330 is disposed on the measurement module planar motion portion 320, and may be perpendicular to the planar motion portion 210; and the measurement light source 340 is, for example, disposed on the measurement module planar motion portion 320 near the 3D laser measurement sensor 330. The measurement module planar motion portion 320 further includes a Y-direction measurement motion axis 321 and a Z-direction measurement motion axis 322.

Namely, the 3D measurement module 300 is mainly configured to obtain point cloud data of the rigid curved-surface substrate/curved-surface underlayment 230 through laser scanning after actual installation thereof, and then use the point cloud data to perform curved-surface reconstruction and splicing to match a CAD design model, so as to achieve precise positioning of the actual processing model. Moreover, regarding inspection of a post-processing error, the same method may also be applied to obtain a result. The measurement sensor support frame 310 is configured to support, connect and fix the 3D laser measurement sensor 330. The Y-direction measurement motion axis 321 is configured to realize switching of the 3D laser measurement sensor 330 between a working state and a non-working state corresponding to two different positions; and the Z-direction measurement motion axis 322 is configured to form a six-degree-of-freedom linkage mode under the working state of the 3D laser measurement module in collaboration with the spherical motor linkage platform 200. The 3D laser measurement sensor 330 is configured to perform point cloud acquisition on the rigid curved-surface substrate/curved-surface underlayment 230, and transmit the point cloud data acquired by the 3D laser measurement sensor 330 to the control module 700 to perform curved-surface surface reconstruction and splicing, and matching calculation and error analysis. In the measurement process, in order to improve the measurement accuracy, a longitudinal curved-surface follow-up mode is adopted; and a motion path is planned within a motion range of the planar motion portion 210 to achieve complete scanning of the rigid curved-surface substrate/curved-surface underlayment 230. A position of the Z-direction measurement motion axis 322 is continuously adjusted according to a vertical height of a partial curved-surface in the CAD design model to ensure that a relative distance between the Z-direction measurement motion axis 322 and the rigid/flexible curved-surface substrate 230/240 remains unchanged in the vertical direction, so that the measured position is always in an optimal depth of field range of the 3D laser measurement sensor 330.

According to the above design, the 3D laser point cloud scanning measurement technology integrated in the method and device of the invention may be increased with a longitudinal curved-surface follow-up technology in the process of using the 3D laser measurement sensor 330 to perform scanning, and even if the vertical position of the 3D laser measurement sensor 330 is varied along with the height of the CAD design model, the relative distance between the 3D laser measurement sensor 330 and the rigid curved-surface substrate/curved-surface underlayment 230 remains unchanged in the vertical direction, so that the acquired point is always in the optimal depth of field range of the 3D laser measurement sensor 330, which may effectively improve the accuracy of point cloud measurement. Moreover, the above measurement technology may also effectively introduce related technical parameters and a point cloud splicing algorithm, which may better match the measured point cloud with the CAD design model, calculate and display errors, reduce requirement of a linear structured light on surface characteristics of the measured object, and ensure accuracy of measurement precision and measurement result.

Figure 6:
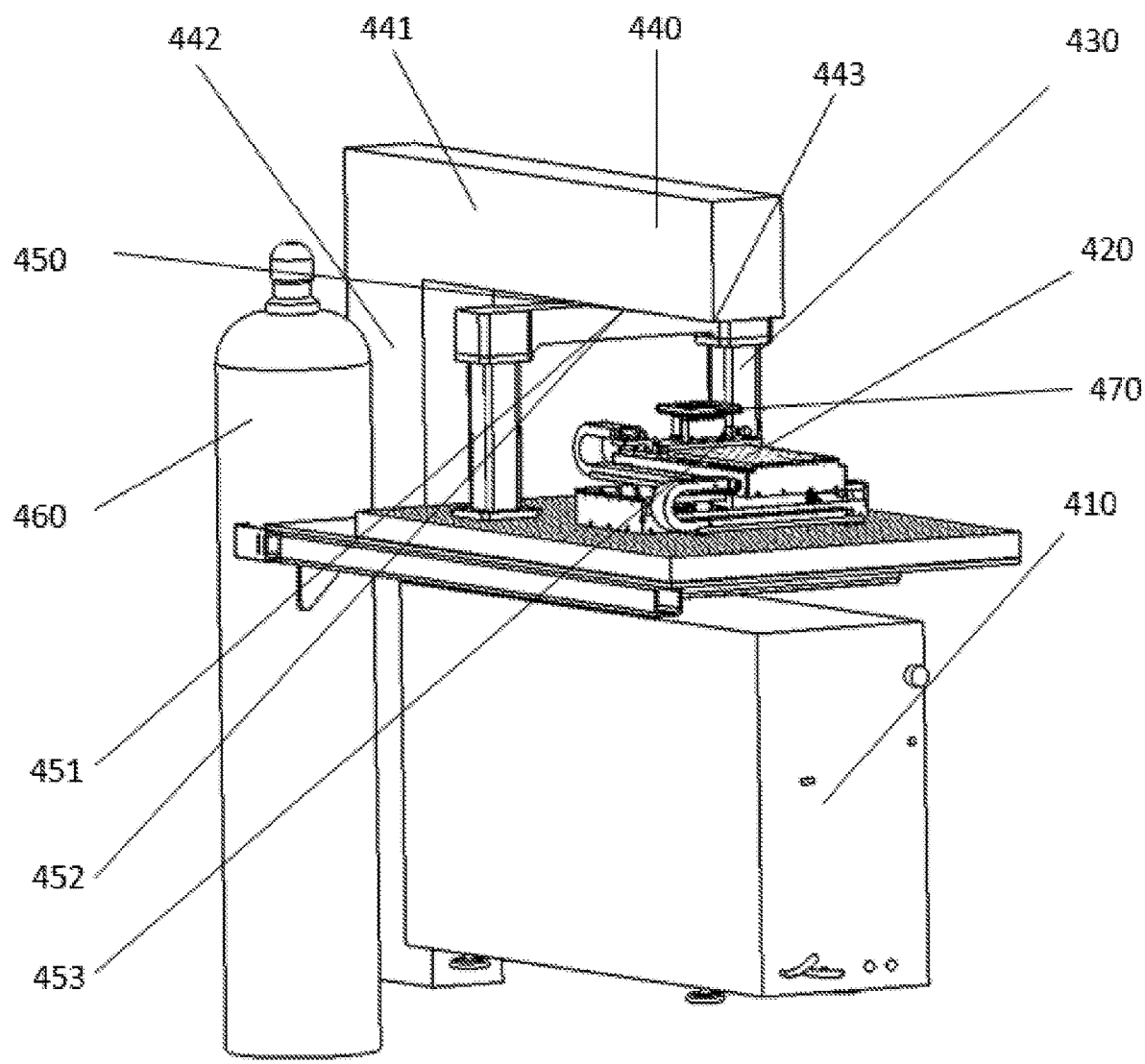
FIG. 6 is a schematic diagram of a detailed structure of a laser lift-off module shown in FIG. 1.
Figure 7:
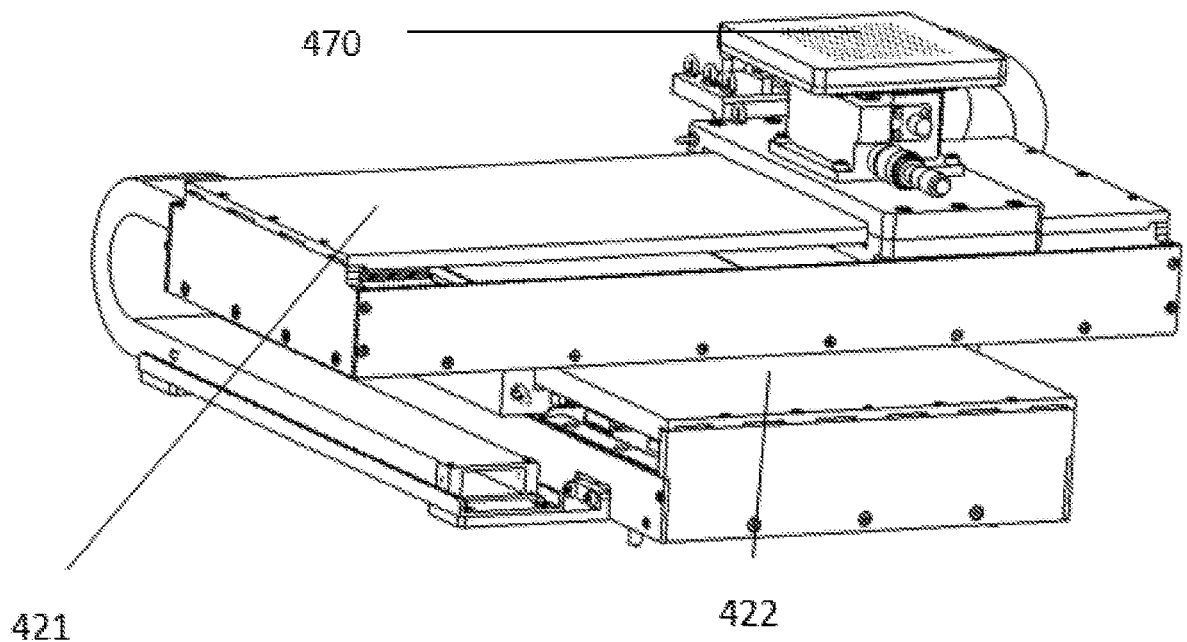
FIG. 7 is a partial structural enlarged view of the laser lift-off module.

Referring to FIGS. 1, 6 and 7, the laser lift-off module 400 includes a laser 410, a peeling module planar motion portion 420, a peeling support clamp 470 and a peeling observation camera 450, etc., where the laser 410 is disposed under the support platform 100, and is configured to emit laser radiation through a matched optical path portion 440, thereby peeling off an electronic component lithographically printed on a transparent rigid planar substrate from the planar substrate; the peeling module planar motion portion 420 is disposed above the laser 410, and has an X-direction peeling motion axis 421 adapted to move along the X-axis direction and a Y-direction peeling motion axis 422 adapted to move along the Y-axis direction; the peeling support clamp 470 is continuously installed on the peeling module planar motion portion 420, and is moved to a required position along with the peeling module planar motion portion 420, and is configured to fix and clamp the electronic component lithographically printed on the planar substrate to execute a laser lift-off operation. Moreover, the peeling observation camera 450 is disposed near the peeling module planar motion portion 420, and is configured to acquire position information of the peeling module planar motion portion 420 in collaboration with a peeling light source 453.

To be specific, referring to FIG. 6 and FIG. 7, the laser 410 is disposed under the support platform 100, the peeling module planar motion portion 420 is disposed on the support platform 100, and an optical path support frame 430 is disposed on the support platform 100, and may be perpendicular to the planar motion portion 210; the optical path portion 440 is disposed on the optical path support frame 430, and a tail end thereof is disposed right above the peeling module planar motion portion 420; the peeling observation camera 450 is disposed on the support platform 100 beside the peeling module planar motion portion 420; a gas tank 460 is disposed beside the support platform 100; the peeling support clamp 470 is disposed on the peeling module planar motion portion 420. The peeling module planar motion portion 420 includes an X-direction peeling motion axis 421 and a Y-direction peeling motion axis 422 intersected perpendicularly on a same plane.

Moreover, the optical path portion 440 may further include a short-axis light uniforming optical path 441 and a long-axis light uniforming optical path 442 including a reflection mirror, a uniaxial beam expanding compound-eye light uniforming array uniaxial aperture, a field lens, an objective lens, etc., and a light outlet 443 at an optical path tail end. The peeling observation camera 450 includes a peeling camera frame 451 disposed on the support platform 100 and perpendicular to the peeling module planar motion portion 420; a peeling observation camera 452 disposed at a tail end of the peeling camera frame 451; and a peeling light source 453 disposed opposite to the peeling observation camera 452.

A basic principle of the laser lift-off process is to use laser irradiation to change a property of a laser release layer (such as PI, sapphire, PZT, amorphous silicon, etc.) between an ultra-thin flexible electronic component (fabricated by a microelectronic process) and a planar substrate (which is usually transparent quartz glass), and use the property of laser energy accumulation to produce physical chemical effects such as sintering, gasification, thermally induced delamination, etc., on the release layer, so as to achieve the purpose of separating the ultra-thin flexible electronic component from the planar substrate. According to the invention, the above laser lift-off process may further control an interface adhesion strength after the laser lift-off, and the control method thereof is preferably to use a fine gridding mask, and by adjusting a gridding feature width and spacing of the fine gridding mask, it is able to control the number of laser irradiations and laser irradiation energy received by a semi-transparent area, so as to achieve selective laser lift-off.

Figure 8:
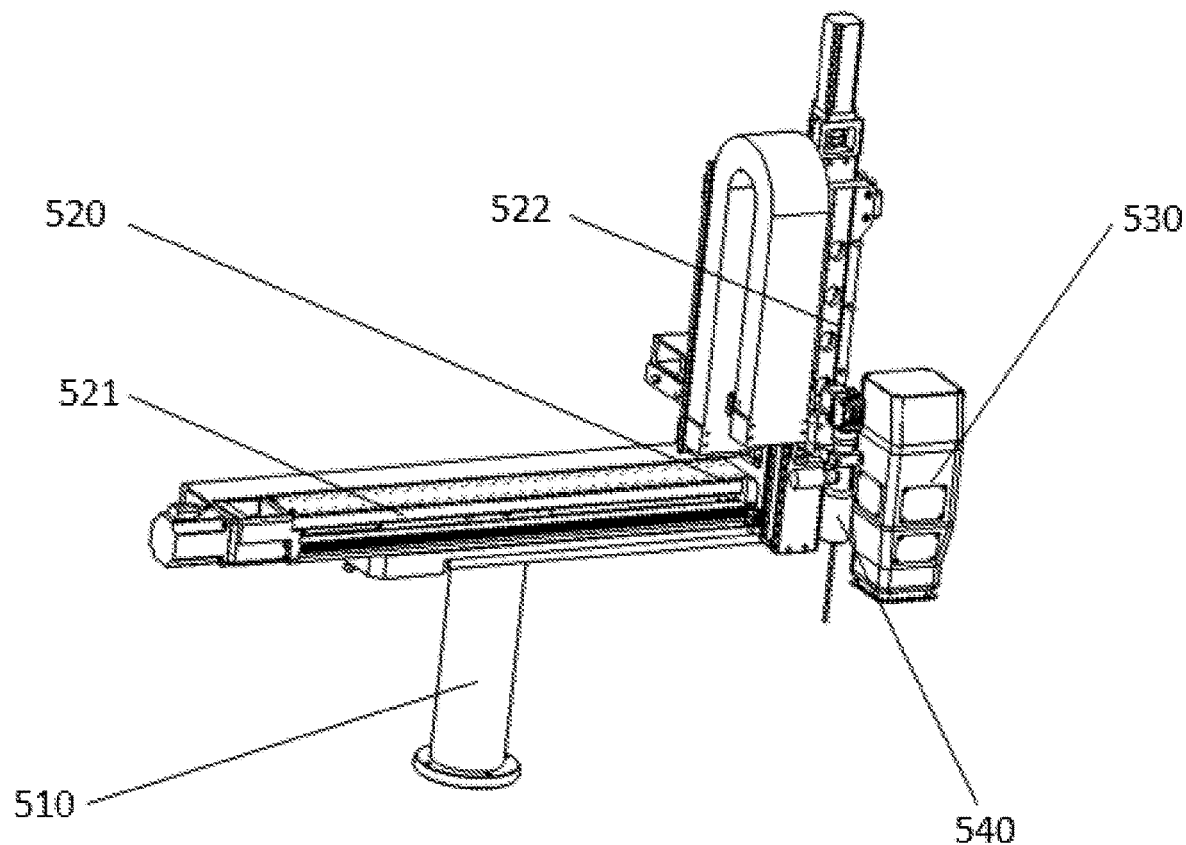
FIG. 8 is a schematic diagram of a detailed structure of a curved-surface transfer printing module shown in FIG. 1.
Figure 9:
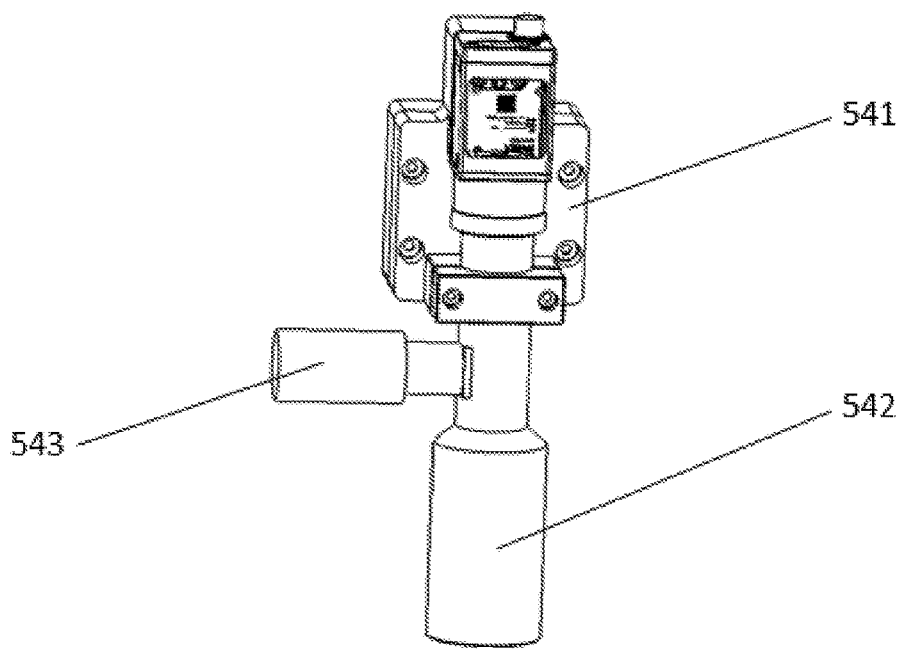
FIG. 9 is a partial structural enlarged view of the curved-surface transfer printing module.

Referring to FIGS. 1, 8 and 9, the curved-surface transfer printing module 500 includes a transfer head support frame 510, a transfer printing module planar motion portion 520, a curved-surface transfer head 530 and a transfer printing positioning camera 540, where the transfer head support frame 510 is directly disposed on the support platform; the transfer printing module planar motion portion 520 is installed on the transfer head support frame 510, and has an X-direction transfer printing motion axis 521 adapted to move along the X-axis and a Z-direction transfer printing motion axis 522 adapted to move along the Z-axis. Moreover, the curved-surface transfer head 530 is continuously installed on the transfer printing module planar motion portion 520, and is moved to a required position along with the transfer printing module planar motion portion 520, and is configured to transfer print the electronic component completing the peeling operation executed by the laser lift-off module 400 to the curved-surface substrate. Moreover, the transfer printing positioning camera 540 is configured to acquire position information of the transfer printing module planar motion portion 520 in collaboration with a transfer printing light source 543.

To be specific, referring to FIG. 8 and FIG. 9, the transfer head support frame 510 is disposed on the support platform 100; the transfer printing module planar motion portion 520 is disposed on the transfer head support frame 510, and is perpendicular to the planar motion portion 210 and the peeling module planar motion portion 420; the curved-surface transfer head 530 is disposed on the transfer printing module planar motion portion 520, and is perpendicular to the planar motion portion 210 and the peeling module planar motion portion 420; the transfer printing positioning camera 540 is disposed on the transfer printing module planar motion portion 520 beside the curved-surface transfer head 530. The transfer printing module planar motion portion 520 includes an X-direction transfer printing motion axis 521 and a Z-direction transfer printing motion axis 522 intersected perpendicularly on a same plane. The transfer printing positioning camera 540 includes a transfer printing camera frame 541 disposed on the Z-direction transfer printing motion axis 522, a transfer printing positioning camera 542 disposed at the tail end of the transfer printing camera frame 541 and a transfer printing light source 543 disposed opposite to the transfer printing positioning camera 542. The curved-surface transfer head 530, for example, mainly includes a linear drive assembly, a sealing assembly, an air pressure assembly, an adjustable sliding assembly, etc.

Based on the above design, the ameliorated curved-surface transfer printing process of the method and device of the invention adopts an active-passive combined curved-surface transfer printing method. To be specific, in the curved-surface transfer-printing process, the most important determinant is the deformability of the transfer head and its conformal precision with the transfer printing position of the curved-surface substrate, so that the active-passive combined curved-surface transfer printing method utilizes a two-step superimposed conformal method of active conformal and passive conformal in the curved-surface transfer printing process to improve the conformal ability and precision of the transfer head. The so-called active conformal is that the curved-surface transfer head 530, in combination with the transfer printing position information, realizes preliminary multi-point conformal of the curved-surface transfer head 530 and the transfer printing position by using its own specific mechanical structure (linear driving assembly); and the so-called passive conformal is based on the active conformal method, and relies on the deformation of a deformable thin-film on the curved-surface transfer head 530 to achieve complete distributed conformal with the transfer printing position. The active-passive combined curved-surface transfer printing method transforms the conformal process from an uncontrollable mode depending on the property of the transfer head itself to a precisely controlled mechanical motion mode, and with assistance of secondary passive conformal, process complexity is greatly reduce, and transfer printing precision is improved, so as to achieve a purpose of integrally transferring the flexible electronic component completing the laser lift-off process from the planar substrate to the rigid/flexible curved-surface substrate in high quality.

Figure 10:
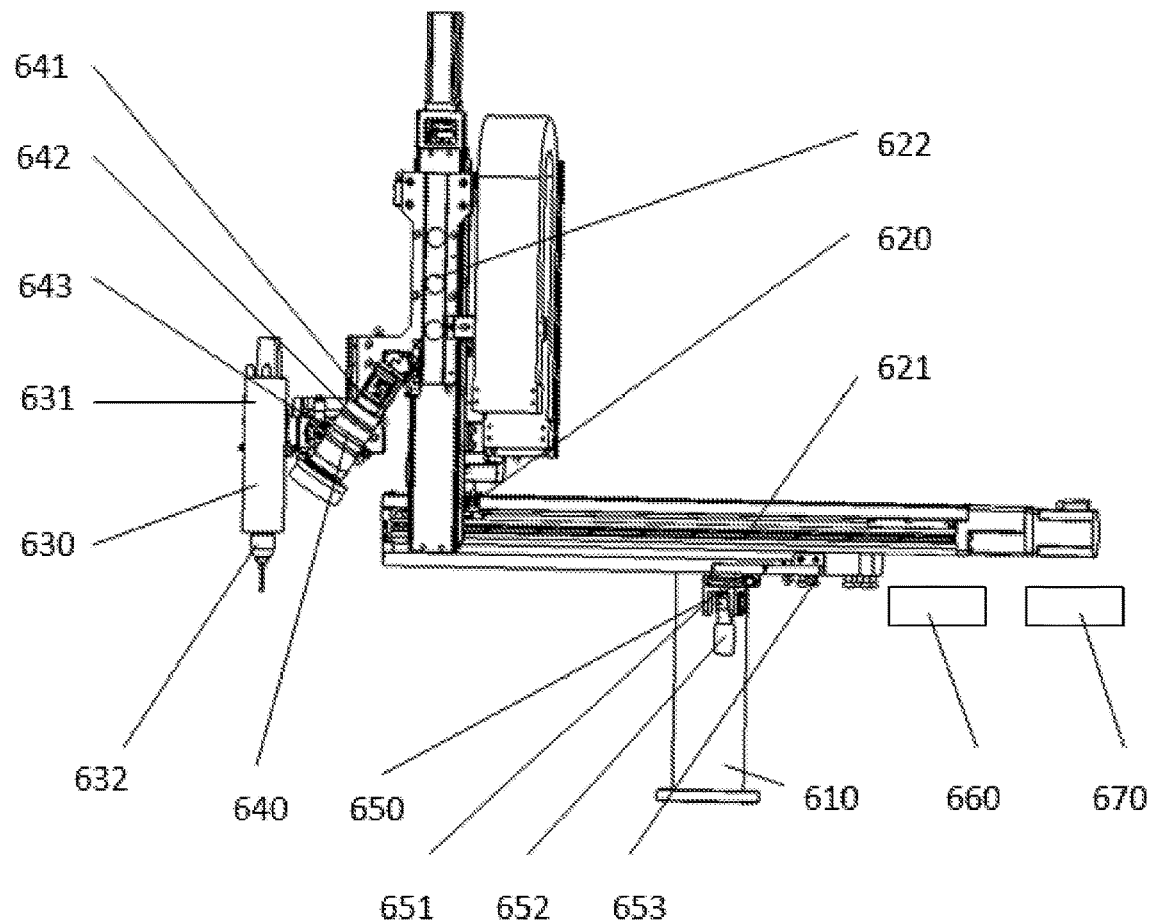
FIG. 10 is a structural assembly diagram of a conformal jet printing module shown in FIG. 1.

Referring to FIGS. 1 and 10, the conformal jet printing module 600 includes a nozzle support frame 610, a jet printing module planar motion portion 620, a nozzle portion 630, a jet printing observation camera 640, an ink droplet observation camera 650, etc., where the nozzle support frame 610 is disposed on the support platform along the Z-axis direction; the jet printing module planar motion portion 620 is installed on the nozzle support frame, and has an X-direction jet printing motion axis 621 adapted to move along the X-axis and a Z-direction jet printing motion axis 622 adapted to move along the Z-axis; the nozzle portion 630 is continuously installed on the jet printing module planar motion portion 620, and is moved to a required position along with the jet printing module planar motion portion 620, and is configured to continuously jet-print a paste on a surface of the curved-surface substrate completing the transfer operation executed by the curved-surface transfer printing module 500, so as to fabricate a conductive interconnection structure. Moreover, the jet printing observation camera 640 is configured to acquire a jet printing trajectory and effect on the curved-surface substrate in collaboration with a jet printing light source 634, and the ink droplet observation camera 650 is configured to acquire a state of an ink droplet sprayed by the nozzle portion in collaboration with an ink droplet observation light source 653.

To be specific, referring to FIG. 10, the nozzle support frame 610 is disposed on the support platform 100; the jet printing module planar motion portion 620 is disposed on the nozzle support frame 610, and is perpendicular to the planar motion portion 210; the nozzle portion 630 is disposed on the jet printing module planar motion portion 620, and is perpendicular to the planar motion portion 210; the jet printing observation camera 640 is disposed on the jet printing module planar motion portion 620 beside the nozzle portion 630; the ink droplet observation camera 650 is disposed on the support platform 100 beside the jet printing module planar motion portion 620, and is perpendicular to the nozzle portion 630; a high voltage amplifier 660; a function generator 670, etc. The jet printing module planar motion portion 620 includes an X-direction jet printing motion axis 621 and a Z-direction jet printing motion axis 622 intersected perpendicularly on a same plane.

Moreover, the nozzle portion 630 preferably includes an integrated ink supply assembly 631 and an air sheath assisted nozzle assembly 632 connected to the integrated ink supply assembly 631. The integrated ink supply assembly 631 mainly includes structures of a stepper motor, a lead screw, a cartridge push rod, a miniature check valve, etc.; the air sheath assisted nozzle assembly 632 mainly includes structures of an inlet, an air sheath assistance, an annular electrode, a nozzle, etc. The jet printing observation camera 640 includes a jet printing camera frame 641 disposed on the Z-direction jet printing motion axis 622, a jet printing observation camera 642 disposed at a tail end of the jet printing camera frame 641, and a jet printing light source 643 disposed opposite to the jet printing observation camera 642. The ink droplet observation camera 650 includes a ink droplet observation camera frame 651 disposed on the support platform 100 beside the jet printing module planar motion portion 620, an ink droplet observation camera 652 disposed at a tail end of the ink droplet observation camera frame 651, and an ink droplet observation light source 653 disposed opposite to the ink droplet observation camera 652.

In other words, the conformal jet printing module 600 is mainly configured to print high-quality conductive interconnection structures, basic components, etc., on the rigid/flexible curved-surface substrate 230/240 in high precision and high uniformity on-demand. The nozzle support frame 610 is configured to support, connect and fix the nozzle portion 630. The X-direction jet printing motion axis 621 in the jet printing module planar motion portion 620 is configured to realize switching of the nozzle portion 630 between a working state and a non-working state corresponding to two different positions; and the Z-direction jet printing motion axis 622 is configured to form a six-degree-of-freedom linkage mode under the working state of the conformal jet printing module 600 in collaboration with the spherical motor linkage platform 200. The integrated ink supply assembly 631 is configured to automatically supply ink to the air sheath assisted nozzle assembly 632, which may realize automatic switching between a flow driving mode and an air pressure driving mode, as well as automatic cleaning of a cartridge. The air sheath assisted nozzle assembly 632 is configured to jet print the ink to the rigid/flexible curved-surface substrate 230/240 to perform high-precision, high-stability patterning and component fabrication, and the air sheath assisted structure strengthens focusing and positioning, and improves smoothness of the jet printing process, and a grounding electrode is integrated into the air sheath assisted nozzle assembly 632 through the annular electrode structure, so that the charged droplets may be accelerated in a stable electric field during the jet printing process, which decreases an interference of a non-uniform electric field on the surface of the rigid/flexible curved-surface substrate 230/240. The jet printing observation camera 640 may realize real-time observation on the shape and quality of a jet printing pattern and detection of a droplet spatial flight trajectory by means of visual real-time acquisition, and may also realize a positioning function between the nozzle structure and the rigid/flexible curved-surface substrate 230/240. The ink droplet observation camera 650 is configured to perform observation on a "Taylor cone" formed at the nozzle structure when the jet printing process is started, so as to ensure stability of the jet printing process and uniformity of a line width of the jet printing pattern. The high voltage amplifier 660 is configured to apply different voltages to the ink and the annular electrode structure, so as to provide the electric field required by the conformal jet printing process; the function generator 670 is configured to provide different voltage signals to the nozzle portion 630 to match and satisfy the requirements of different jet printing conditions.

According to the above design, the improved conformal jet printing process in the method and device of the invention utilizes the principle and method of electro jet printing to directly print a paste material such as high-viscosity nano-silver paste on the surface of the rigid/flexible curved-surface substrate to form a high-resolution structure, so as to achieve jet printing manufacturing of the high conductivity interconnect structure. In order to achieve the curved-surface conformal jet printing, and overcome the influence of uneven electric field on the curved-surface substrate, a nozzle system of the electro jet printing requires a special design, where an annular electrode is integrated under the nozzle structure to accelerate the ejected charged droplets in a stable electric field; and an air-sheath-assisted electrohydrodynamic nozzle is proposed to enhance focusing and positioning to ensure accurate jet printing in a non-uniform electric field on the surface of the curved-surface substrate. Moreover, based on flexible, fast and accurate motion coordination of the conformal jet printing process and the six-degree-of-freedom spherical motor linkage technology, the function of direct jet printing of high-quality conductive interconnection structures and basic components on the curved-surface substrate in high precision and high uniformity on-demand may be realized.

Figure 11:
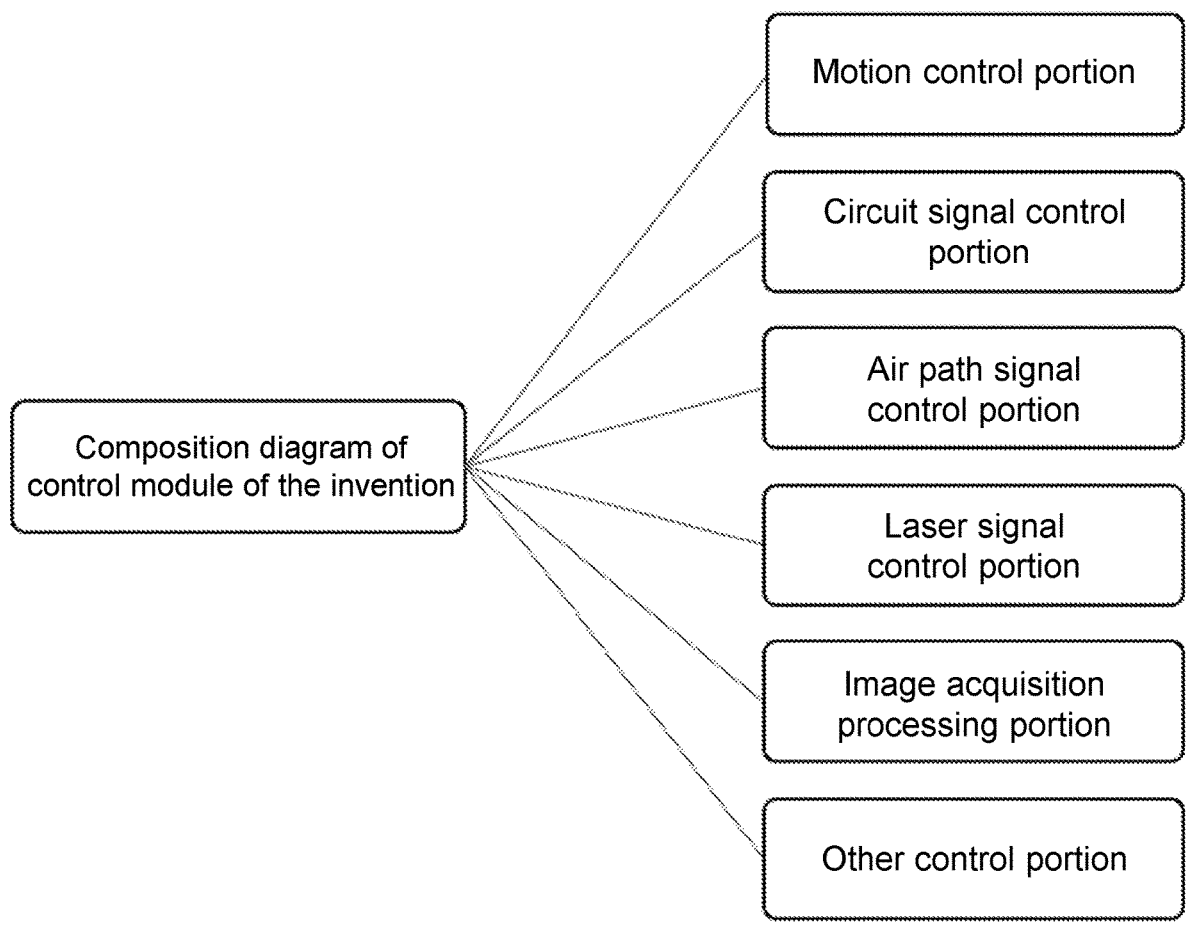
FIG. 11 is a schematic diagram of a detailed composition of a control module shown in FIG. 1.

Finally, the control module 700 may include a motion control portion, a circuit signal control portion, an air path signal control portion, a laser signal control portion, an image acquisition processing portion, etc., which are all integrated in the form of a control card and software, and FIG. 11 may be referred for composition thereof. In overall, the control module 700 is configured to control a coordination motion of the 3D measurement module 300, the laser lift-off module 400, the curved-surface transfer printing module 500, the conformal jet printing module 600 and the spherical motor linkage platform 200; and provides the electrical signals required for 3D laser point cloud scanning measurement, laser lift-off, curved-surface transfer printing, conformal jet printing, etc., performed on-demand on the rigid/flexible curved-surface substrate 230/240 and the curved-surface underlayment 230 carrying the flexible electronic component on the peeling support clamp 470, and finally realize coordination control of motion distribution, laser signal distribution, electrical signal distribution and air signal distribution of the whole device. Moreover, the control module 700 controls all of the visual cameras in the whole device at the same time, and may process and feed back the acquired image in real-time.

A process flow of the conformal manufacturing device of the invention is described in detail below.

Step One: 3D Measurement and Positioning Operation

First, tightly mount a rigid or flexible curved-surface substrate on the linkage platform planar motion portion (210) of the spherical motor linkage platform, and set 3D measurement and positioning process parameters for the 3D laser measurement sensor (330), and perform and scanning on the curved-surface substrate according to a measured motion trajectory path to generate a point cloud model; then, perform position matching on the point cloud model and a design model, and determine whether an error accuracy requirement of a subsequent process is met, and if the error accuracy requirement is not met, reproducing or mounting the curved-surface substrate until the error accuracy requirement is met.

In the above step, the measured motion trajectory path of the 3D laser measurement sensor 330 is, for example, introduced into the control module 700 to set 3D measurement and positioning process parameters, and the rigid curved-surface substrate/curved-surface underlayment 230 is scanned according to the measured motion trajectory path to generate the point cloud model; the 3D measurement and positioning process parameters may include: a scanning speed, a lens size, a measuring range, a measuring distance, a signal to noise ration, etc.; moreover, the CAD design model may be introduced into the control module 700 to perform position matching of the point cloud model and the CAD design model to show an error deviation, and calculate an error percentage to determine whether the error accuracy requirement of the subsequent process is met.

Step Two: Laser Lift-Off Operation

Deposit a laser release layer (such as laser amorphous silicon) on a planar substrate (such as a transparent quartz glass substrate), prepare the flexible electronic component on top of the laser release layer by using a microelectronic process, and then selectively peel the electronic component off the planar substrate by placing the gridding mask and adjusting the laser lift-off process parameter; and meanwhile adopt the peeling observation camera 450 to perform positioning and observation;

To be specific, according to a preferable embodiment of the invention, a transparency-controllable patterned mask having a semi-transparent area may be placed at a specified position between the flexible electronic component and the light outlet 443 at an optical path tail end for adjusting and controlling the laser irradiation energy absorbed by the laser release layer, so as to achieve selective laser lift-off; then, the planar substrate to be peeled off (including the laser release layer and the flexible electronic component) is placed on the peeling support clamp 470 in the laser lift-off module 400, and the peeling observation camera 450 is applied for positioning and observation, and after adjusting the laser lift-off process parameters, the laser lift-off is carried out; the laser lift-off process parameters may include a laser energy density, a light spot size and shape, a pulse frequency, a transparency of the semi-transparent area of the patterned mask, peeling motion path, a peeling motion speed, etc.

Step Three: Curved-Surface Transfer Printing Operation

Use the transfer printing positioning camera 540 to perform positioning, and move the curved-surface transfer head 530 to a designated position above the electronic component completing the laser lift-off operation; and open an air pressure adsorption function to vertically contact the curved-surface transfer head 530 downwards to the electronic component, so as to raise the electronic component by a negative pressure; then, again use the transfer printing positioning camera 540 to perform positioning, and move the curved-surface transfer head 530 to a designated position above the curved-surface substrate, and adjust the curved-surface transfer head to integrally transfer the electronic component to the curved-surface substrate according to the transfer printing position information;

To be specific, the curved-surface transfer printing process parameters are first adjusted, and the transfer printing positioning camera 540 is used to perform positioning, and the curved-surface transfer head 530 is moved to the designated position above the electronic component completing the laser lift-off process; and then the air pressure adsorption function is opened, the curved-surface transfer head 530 moves vertically and downwards to contact the electronic component, so as to "pick up" the electronic component by a negative pressure; and then the transfer printing positioning camera 540 is applied to perform positioning, and the curved-surface transfer head 530 is moved to the designated position above the curved-surface substrate, and a mechanical structure (which, for example, includes an adjustable sliding assembly array, a linear driving assembly, etc.) of the curved-surface transfer head 530 is adjusted according to the transfer printing position information to implement preliminary multi-point conformal, and then a posture and a position of the rigid curved-surface substrate/curved-surface underlayment 230 are adjusted through a six-degree-of-freedom linkage mode, such that a target transfer printing position thereon is located right below the curved-surface transfer head 530; and then the curved-surface transfer head 530 is "placed" downwards, such that the flexible electronic component and the curved-surface substrate are attached, and a complete distributed conformal of the flexible electronic component and the curved-surface substrate is realized through the deformable thin-film of the curved-surface transfer head 530, and then the deformable thin-film of the curved-surface transfer head 530 is expanded by using a positive air pressure, so that the flexible electronic component and the curved-surface transfer head 530 are separated to complete transferring the flexible electronic component to the curved-surface substrate in integration, high precision and high quality.

The curved-surface transfer printing parameters include a transfer printing motion speed, a "pick up"/"placing" motion distance, a posture adjustment linkage path, an air pressure control, an adjustable sliding assembly shift value, etc.

Step Four: Conformal Jet Printing Operation

First, adjust conformal jet printing process parameters, and select the flow or air pressure ink supplying mode according to the need, and move the nozzle portion 630 to a place of the ink droplet observation camera 650, use the ink droplet observation camera 652 to observe an ink droplet state under the nozzle, and record all process parameters required for stable injection when the ink droplet forms a stable Taylor cone; and then introduce a six-degree-of-freedom motion trajectory of the conformal jet printing, perform on-demand jet printing on the curved-surface substrate according to a predetermined conformal jet printing trajectory path, and use the jet printing observation camera 640 to position and observe the conformal jet printing process; and when the curved-surface conformal on-demand jet printing is completed, again use the jet printing observation camera 640 to perform positioning calibration on pins of the electronic component, and connect pin pairs of the electronic component one-by-one according to pin position information;

Finally, the entire manufacturing system is replaced to complete the conformal manufacturing process of the complex curved-surface electronic system.

In summary, compared to the existing technique, the conformal manufacturing device and method of the invention may better combine processes such as conformal electrohydrodynamic printing, complex curve-surface transfer printing, large area laser lift-off, etc., with innovative structures such as a curved-surface positioning device, six-degree-of-freedom spherical motor linkage, etc., to breakthrough the current situation that the existing electronic manufacturing technology and equipment are limited to planar manufacturing mode, and it is difficult to realize integration and mass manufacturing of complex curved-surface electronic system, and resolve bottlenecks and problems encountered in various processes; correspondingly, the basic manufacturing process of rigid/flexible curved-surface electronic system may be realized more completely and automatically, including key steps of precise positioning and error detection of the rigid/flexible curved-surface substrate, peeling of ultra-thin flexible electronic component on the planar substrate, transfer printing of flexible electronic component from the planar substrate to the curved-surface substrate, and direct manufacturing of interconnected high-performance circuits thereon.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A conformal manufacturing device for hybrid manufacturing of a rigid or flexible curved-surface electronic component, the conformal manufacturing device comprising a support platform having a spherical motor linkage platform, a three-dimensional measurement module, a laser lift-off module, a curved-surface transfer printing module, and a conformal jet printing module respectively mounted on the support platform and being independently controllable, wherein:

the spherical motor linkage platform comprises a linkage platform planar motion portion and a spherical motor portion, wherein the linkage platform planar motion portion is directly disposed on the support platform and has an X-direction motion axis adapted to move along an X-axis direction and a Y-direction motion axis adapted to move along a Y-axis direction, wherein the spherical motor portion is continuously arranged on the linkage platform planar motion portion and moves along with the linkage platform planar motion portion, and wherein the spherical motor portion is adhered with a rigid curved-surface substrate or a curved-surface underlayment carrying a flexible curved-surface substrate and drives the rigid curved-surface substrate or the curved-surface underlayment to rotate to required postures in space;

the three-dimensional measurement module comprises a measurement sensor support frame, a measurement module planar motion portion, a three-dimensional laser measurement sensor, and a measurement light source, wherein the measurement sensor support frame is directly disposed on the support platform, wherein the measurement module planar motion portion is installed on the measurement sensor support frame and has a Y-direction measurement motion axis adapted to move along the Y-axis direction and a Z-direction measurement motion axis adapted to move along a Z-axis direction and wherein the three-dimensional laser measurement sensor is continuously installed on the measurement module planar motion portion, is moved to a required position along with the measurement module planar motion portion, and is configured to perform point cloud acquisition on the curved-surface substrate or the curved-surface underlayment adhered to the spherical motor portion in collaboration with the measurement light source, and then to generate a point cloud module to perform a matching calculation with a corresponding design model;

the laser lift-off module includes a laser, a peeling module planar motion portion, a peeling support clamp, and a peeling observation camera, wherein the laser is disposed under the support platform and is configured to emit laser radiation through a matched optical path portion, thereby peeling off an electronic component lithographically printed on a transparent rigid planar substrate from the transparent rigid planar substrate, wherein the peeling module planar motion portion is disposed above the laser and has an X-direction peeling motion axis adapted to move along the X-axis direction and a Y-direction peeling motion axis adapted to move along the Y-axis direction, wherein the peeling support clamp is continuously installed on the peeling module planar motion portion, is moved to a required position along with the peeling module planar motion portion, is configured to fix and clamp the electronic component lithographically printed on the planar substrate to execute a laser lift-off operation, and wherein the peeling observation camera is disposed near the peeling module planar motion portion and is configured to acquire position information of the peeling module planar motion portion in collaboration with a peeling light source;

the curved-surface transfer printing module comprises a transfer head support frame, a transfer printing module planar motion portion, a curved-surface transfer head, and a transfer printing positioning camera, wherein the transfer head support frame is directly disposed on the support platform, wherein the transfer printing module planar motion portion is installed on the transfer head support frame and has an X-direction transfer printing motion axis adapted to move along the X-axis and a Z-direction transfer printing motion axis adapted to move along the Z-axis, wherein the curved-surface transfer head is continuously installed on the transfer printing module planar motion portion, is moved to a required position along with the transfer printing module planar motion portion, and is configured to transfer print the electronic component peeled off by the laser lift-off module to the rigid or flexible curved-surface substrate, and wherein the transfer printing positioning camera is configured to acquire position information of the transfer printing module planar motion portion in collaboration with a transfer printing light source; and the conformal jet printing module comprises a nozzle support frame, a jet printing module planar motion portion, a nozzle portion, a jet printing observation camera, and an ink droplet observation camera, wherein the nozzle support frame is disposed on the support platform along the Z-axis direction, wherein the jet printing module planar motion portion is installed on the nozzle support frame and has an X-direction jet printing motion axis adapted to move along the X-axis and a Z-direction jet printing motion axis adapted to move along the Z-axis, wherein the nozzle portion is continuously installed on the jet printing module planar motion portion, is moved to a required position along with the jet printing module planar motion portion, and is configured to continuously jet-print a paste on a surface of the electronic component transferred to the rigid or flexible curved-surface substrate so as to fabricate a conductive interconnection structure, wherein the jet printing observation camera is configured to acquire a jet printing trajectory and effect on the rigid or flexible curved-surface substrate in collaboration with a jet printing light source, and wherein the ink droplet observation camera is configured to acquire a state of an ink droplet sprayed by the nozzle portion in collaboration with an ink droplet observation light source.

2. The conformal manufacturing device as claimed in claim 1, wherein during the point cloud acquisition, a position of the three-dimensional laser measurement sensor is adjusted constantly, and a spacing between three-dimensional laser measurement sensor and the rigid or flexible curved-surface substrate in the Z-axis direction remains unchanged.

3. The conformal manufacturing device as claimed in claim 1, wherein the optical path portion is arranged on the support platform along the Z-axis direction through an optical path support frame, and is configured to shape, uniform, and adjust a direction of a laser beam emitted by the laser, a tail end of the optical path portion being located immediately above the peeling module planar motion portion.

4. The conformal manufacturing device as claimed in claim 3, wherein a fine gridding mask is adopted to control a peeling laser intensity, whereby the number of laser irradiations and laser irradiation energy on the electronic component lithographically printed on the transparent rigid planar substrate are controlled by adjusting a gridding feature width and spacing of the fine gridding mask.

5. The conformal manufacturing device as claimed in claim 1, wherein the curved-surface transfer head works in active-passive combination such that a preliminary multi-point active conformal with the rigid or flexible curved-surface substrate is achieved through a mechanical motion structure inside the curved-surface transfer head, and then a complete distributed passive conformal with the rigid or flexible curved-surface substrate is achieved based on a deformable thin-film of the curved-surface transfer head.

6. The conformal manufacturing device as claimed in claim 1, wherein the nozzle portion comprises an integrated ink supply assembly and an air sheath auxiliary nozzle assembly connected to the integrated ink supply assembly, wherein the integrated ink supply assembly is configured to automatically supply ink to the air sheath auxiliary nozzle assembly and is adapted to implement automatic switch between a flow driving mode and air pressure driving mode, wherein the air sheath auxiliary nozzle assembly is used for jet-printing the ink onto the electronic component transferred to the rigid or flexible curved-surface substrate, and wherein an annular electrode is arranged under the nozzle.

7. The conformal manufacturing device as claimed in claim 1, wherein the conformal manufacturing device further comprises a control module configured to execute functions of receiving, processing and transmitting electrical control signals throughout the manufacturing process.

8. A method for using the conformal manufacturing device of claim 1 to produce a complex curved-surface electronic system, the method comprising:
step one: three-dimensional measurement and positioning operation, comprising:
first, tightly mounting the rigid or flexible curved-surface substrate on the linkage platform planar motion portion of the spherical motor linkage platform, setting three-dimensional measurement and positioning process parameters for the three-dimensional laser measurement sensor, and performing scanning on the rigid or flexible curved-surface substrate according to a measured motion trajectory path to generate a point cloud model; and then performing position matching on the point cloud model and a design model, determining whether an error accuracy requirement required for a subsequent process is met, and if the error accuracy requirement is not met, reproducing or mounting the rigid or flexible curved-surface substrate until the error accuracy requirement is met;
step two: laser lift-off operation, comprising:
depositing a laser release layer on a planar substrate, manufacturing the electronic component on top of the laser release layer by using a microelectronic process, then moving the electronic component lithographically printed on the planar substrate to a required position and fixedly clamping the electronic component by the peeling support clamp, and then selectively peeling off the electronic component from the planar substrate by placing a gridding mask and adjusting a parameter of the laser lift-off process while adopting the peeling observation camera to perform positioning and observation;
step three: curved-surface transfer printing operation, comprising:
using the transfer printing positioning camera to perform positioning, and moving the curved-surface transfer head to a designated position above the electronic component peeled by the laser lift-off operation; opening an air pressure adsorption function and moving the curved-surface transfer head vertically and downwards to contact the electronic component so as to pick up the electronic component by a negative pressure; again using the transfer printing positioning camera to perform positioning, and moving the curved-surface transfer head to a designated position above the rigid or flexible curved-surface substrate, and adjusting a posture and a position of the rigid or flexible curved-surface substrate through the spherical motor linkage platform so that a current transfer printing position is directly below the rigid or flexible curved-surface transfer head; and completely transferring the electronic component to the rigid or flexible curved-surface substrate through a quadratic conformal method; and
step four: conformal jet printing operation, comprising:
first adjusting conformal jet printing process parameters, selecting a flow or air pressure ink supplying mode, moving the nozzle portion to a place of the ink droplet observation camera, using the ink droplet observation camera to observe an ink droplet state under the nozzle, and recording all process parameters required for stable injection such that the ink droplet forms a stable Taylor cone; introducing a six-degree-of-freedom motion trajectory of the conformal jet printing, performing on-demand jet printing on the rigid or flexible curved-surface substrate according to a predetermined conformal jet printing trajectory path, and using the jet printing observation camera to position and observe the conformal jet printing process; and when the curved-surface conformal on-demand jet printing is completed, again using the jet printing observation camera to perform positioning calibration on pins of the electronic component, and connecting pin pairs of the electronic component one-by-one according to pin position information.

9. The method as claimed in claim 8, wherein the quadratic conformal method is operated by means of active-passive combination:
first, moving the curved-surface transfer head to a designated position above the rigid or flexible curved-surface substrate, and executing preliminary multi-point active conformal; attaching the electronic component and the rigid or flexible curved-surface substrate to execute quadratic distributed passive conformal by using a deformable thin-film of the curved-surface transfer head; and using a positive air pressure to expand the deformable thin-film of the curved-surface transfer head to separate the electronic component from the curved-surface transfer head, so as to complete the operation of transfer printing the electronic component to the rigid or flexible curved-surface substrate.

\* \* \* \* \*